(12) United States Patent
Sato et al.

(10) Patent No.: US 8,139,407 B2
(45) Date of Patent: Mar. 20, 2012

(54) NONVOLATILE SEMICONDUCTOR MEMORY DEVICE INCLUDING NAND-TYPE FLASH MEMORY AND THE LIKE

(75) Inventors: Atsuhiro Sato, Yokohama (JP); Keiji Shuto, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/955,621

(22) Filed: Nov. 29, 2010

(65) Prior Publication Data

US 2011/0069542 A1    Mar. 24, 2011

Related U.S. Application Data

(62) Division of application No. 12/354,946, filed on Jan. 16, 2009, now Pat. No. 7,859,898, which is a division of application No. 11/474,340, filed on Jun. 26, 2006, now abandoned.

(30) Foreign Application Priority Data

Jan. 6, 2006 (JP) ................. 2006-001456

(51) Int. Cl.
*G11C 11/34* (2006.01)
*G11C 16/04* (2006.01)
(52) U.S. Cl. .............. 365/185.02; 365/185.18
(58) Field of Classification Search .............. 365/185.02
See application file for complete search history.

(56) References Cited

U.S. PATENT DOCUMENTS

| 5,867,429 | A | 2/1999 | Chen et al. |
| 6,314,026 | B1 | 11/2001 | Satoh et al. |
| 6,807,104 | B2 | 10/2004 | Arai et al. |
| 6,870,773 | B2 * | 3/2005 | Noguchi et al. ......... 365/185.22 |
| 6,878,985 | B2 | 4/2005 | Arai et al. |
| 6,958,938 | B2 | 10/2005 | Noguchi et al. |
| 7,020,025 | B2 | 3/2006 | Sato et al. |
| 7,366,013 | B2 | 4/2008 | Roohparvar |
| 2009/0323432 | A1 | 12/2009 | Futatsuyama et al. |
| 2010/0091566 | A1 | 4/2010 | Sato et al. |

FOREIGN PATENT DOCUMENTS

| JP | 2002-324400 | 11/2002 |
| JP | 2004-192789 | 7/2004 |
| JP | 2004-326866 | 11/2004 |
| JP | 2005-538485 | 12/2005 |
| JP | 2007-519162 | 7/2007 |

* cited by examiner

*Primary Examiner* — Hoai V Ho
*Assistant Examiner* — Kretelia Graham
(74) *Attorney, Agent, or Firm* — Oblon, Spivak, McClelland, Maier & Neustadt, L.L.P.

(57) ABSTRACT

A nonvolatile semiconductor memory device is provided with a memory cell array, a judgment potential correction circuit, and a readout circuit. In the memory cell array, a plurality of memory cells are arranged in a matrix form, and the array includes a first memory cell as a readout object and a second memory cell disposed adjacent to the first memory cell. The judgment potential correction circuit corrects a judgment potential based on a threshold value of the second memory cell. The readout circuit reads the first memory cell as the readout object by use of the corrected judgment potential.

6 Claims, 15 Drawing Sheets

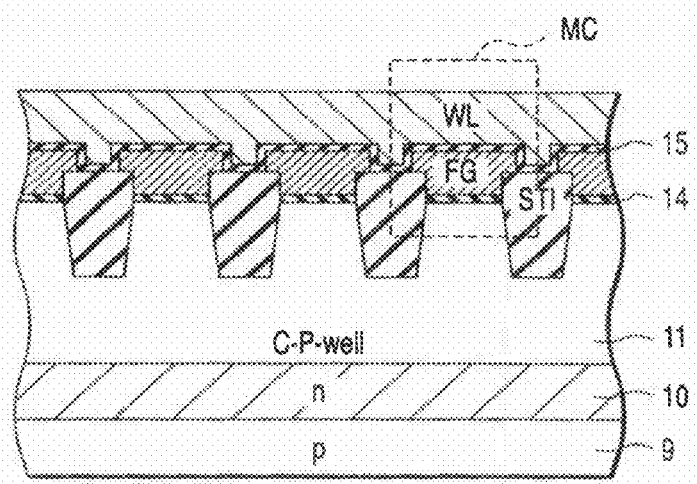
FIG. 6  Row direction section (memory cell)
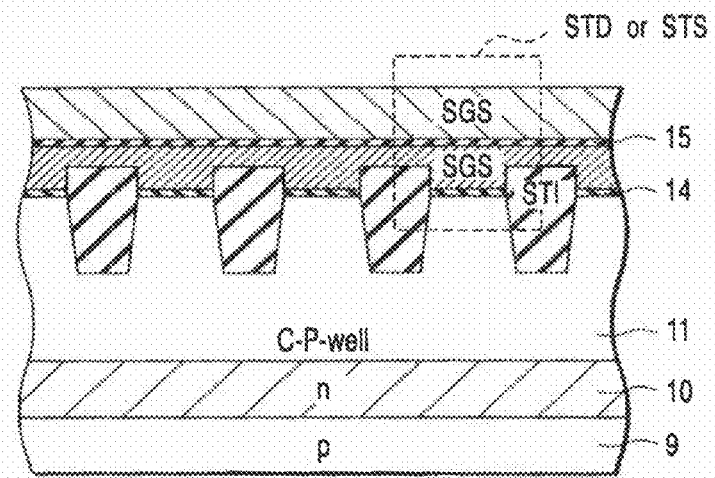
FIG. 7  Row direction section (selection transistor)

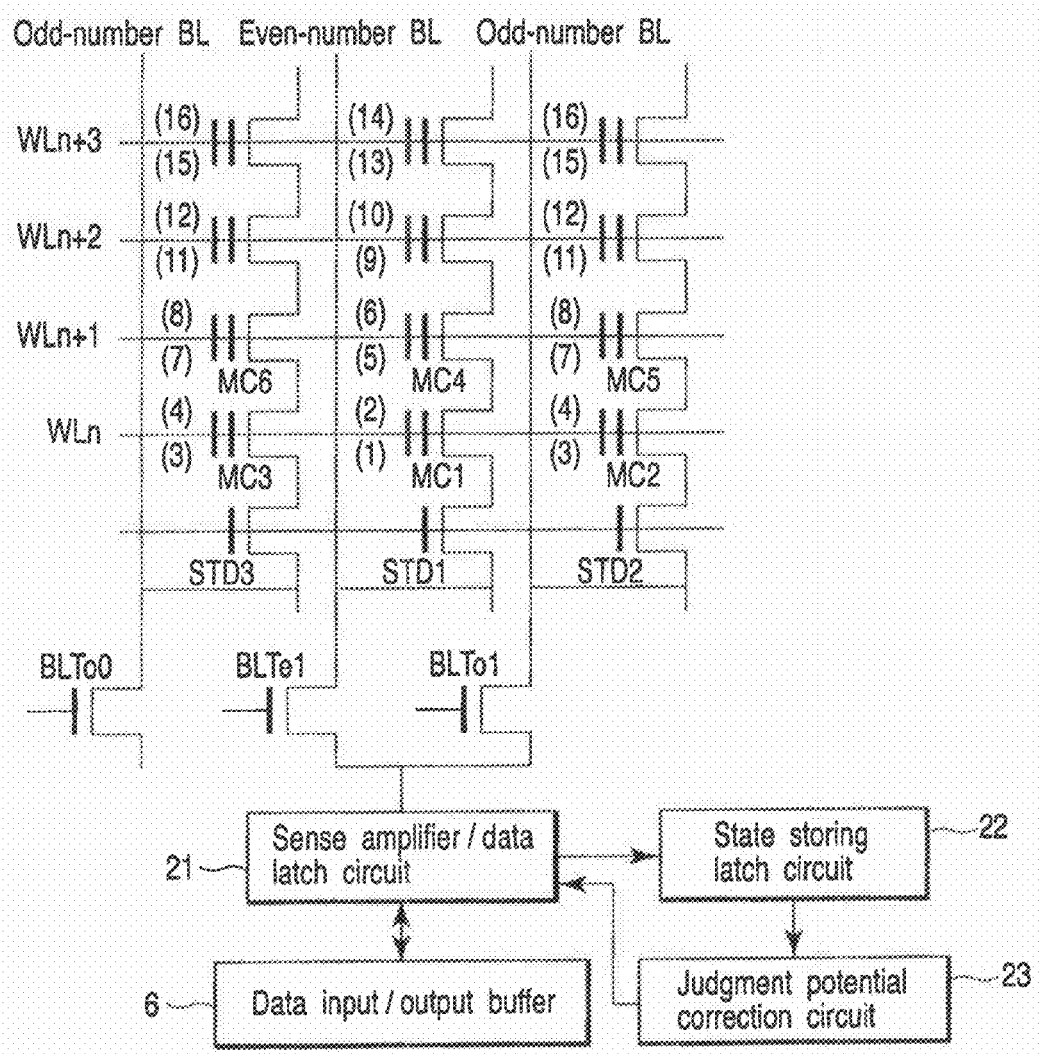
F I G. 8

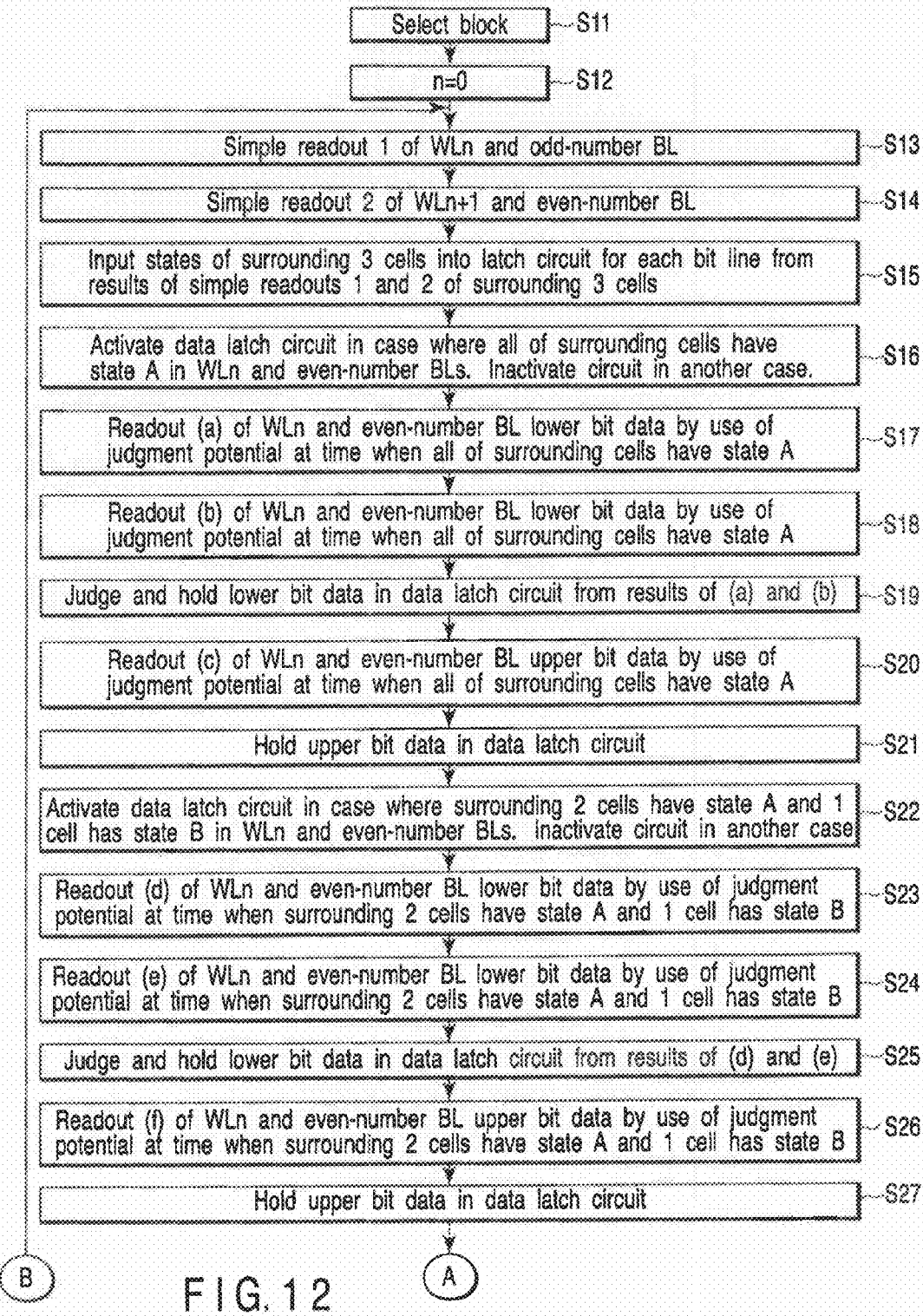
F I G. 12

NONVOLATILE SEMICONDUCTOR MEMORY DEVICE INCLUDING NAND-TYPE FLASH MEMORY AND THE LIKE

CROSS-REFERENCE TO RELATED APPLICATIONS

This application is a divisional application of U.S. patent application Ser. No. 12/354,946 filed Jan. 16, 2009, and claims the benefit of priority under 35 U.S.C. §120 from U.S. patent application Ser. No. 11/474,340, filed on Jun. 26, 2006, and claims the benefit of priority under 35 U.S.C. §119 from Japanese Patent Application No. 2006-001456, filed Jan. 6, 2006, the entire contents of each of which are incorporated herein by reference.

BACKGROUND OF THE INVENTION

1. Field of the Invention

The present invention relates to a nonvolatile semiconductor memory device, more particularly to an NAND-type flash memory.

2. Description of the Related Art

In recent years, in an NAND-type multivalued flash memory, a threshold-value fluctuation of a read cell is generated by a parasitic capacity between floating gates of a memory cell (readout cell) as a readout object and a memory cell adjacent to this read-out cell, and this has been a serious problem (see, e.g., Jpn. Pat. Appln. KOKAI Publication No. 2004-192789). This threshold-value fluctuation due to this parasitic capacity is referred to as a proximity effect herein. Since threshold values of bit data are tightly distributed in the multivalued memory, there is little margin in a breadth of the threshold-value distribution due to the proximity effect. Additionally, in recent years, a value of the proximity effect itself is increasing owing to miniaturization of the memory cell, and this has been a large barrier to realization of a minute multivalued memory.

BRIEF SUMMARY OF THE INVENTION

A nonvolatile semiconductor memory device in a first aspect of the present invention comprises: a memory cell array including a plurality of memory cells arranged in a matrix form, the plurality of memory cells including a first memory cell as a readout object and second memory cells disposed adjacent to the first memory cell; a judgment potential correction circuit which corrects a judgment potential based on a threshold value of the second memory cells; and a readout circuit which reads the first memory cell as the readout object by use of the judgment potential corrected by the judgment potential correction circuit.

A nonvolatile semiconductor memory device in a second aspect of the present invention comprises: a memory cell array including a plurality of memory cells arranged in a matrix form, the plurality of memory cells including a first memory cell, a second memory cell and a third memory cell, the first memory cell being connected to a word line, the second memory cell being disposed adjacent to the first memory cell and connected to the word line and a bit line, and the third memory cell being disposed adjacent to the second memory cell and connected to the bit line; a write circuit which writes data into the second memory cell after writing data into the first memory cell; a judgment potential correction circuit which corrects a judgment potential based on a threshold value of the third memory cell disposed adjacent to the second memory cell and connected to the bit line; and a readout circuit which reads the second memory cell by use of the judgment potential corrected by the judgment potential correction circuit.

A nonvolatile semiconductor memory device in a third aspect of the present invention comprises: a memory cell array including a plurality of memory cells arranged in a matrix form, the plurality of memory cells including a first memory cell, a second memory cell, a third memory cell and a fourth memory cell, the first memory cell being connected to a first word line and a first bit line, the second memory cell being disposed adjacent to the first memory cell and connected to the first word line, a third memory cell being disposed adjacent to the first memory cell and connected to a second word line and the first bit line, and the fourth memory cell being disposed adjacent to the third memory cell and connected to the second word line; and a write circuit which writes lower bit data into the first memory cell, the second memory cell, the third memory cell, and the fourth memory cell, and upper bit data into the first memory cell and the second memory cell in this order.

BRIEF DESCRIPTION OF THE SEVERAL VIEWS OF THE DRAWING

FIG. 6 is a sectional view showing one example of a row direction structure of the memory cell array in the nonvolatile semiconductor memory device of the first embodiment;

FIG. 7 is a sectional view showing one example of a row direction structure of a selection transistor in the nonvolatile semiconductor memory device of the first embodiment;

FIG. 8 is a diagram showing the memory cell array in the nonvolatile semiconductor memory device of the first embodiment, and a main part of a column control circuit;

FIG. 12 is a first flowchart showing a readout operation in the nonvolatile semiconductor memory device of the first embodiment;

DETAILED DESCRIPTION OF THE INVENTION

Here, there will be described one example of a nonvolatile semiconductor memory device in accordance with an NAND-type multivalued flash memory, but the present invention is not limited to this memory, and the present invention is also applicable to a memory other than the NAND-type multivalued flash memory.

Figure 1:
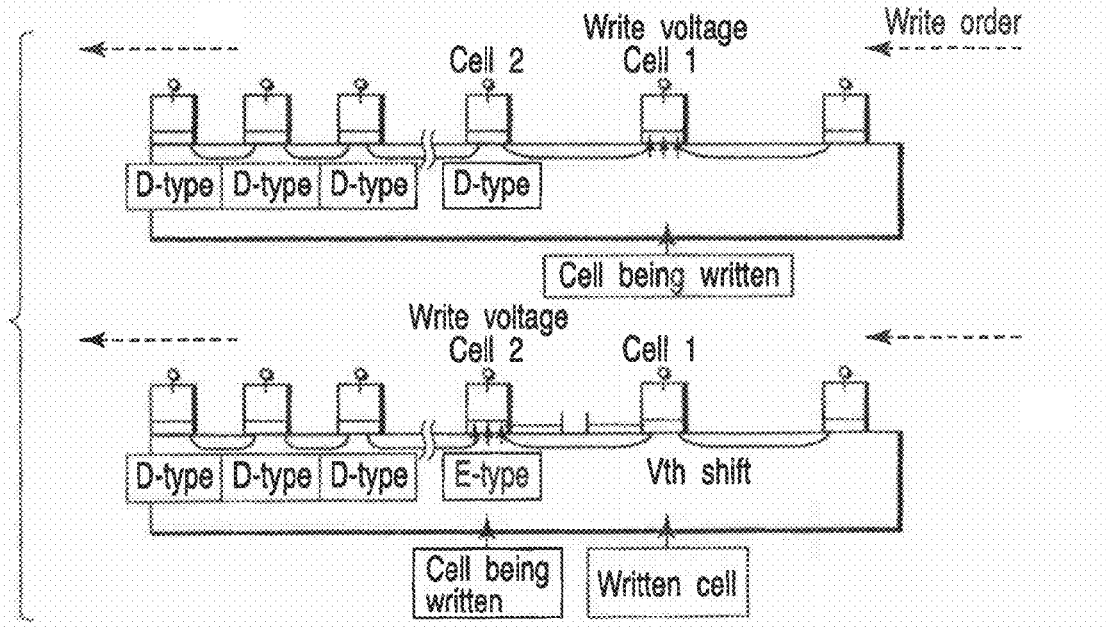
FIG. 1 is a sectional view showing a proximity effect produced between adjacent memory cells.
Figures 2A, 2B:
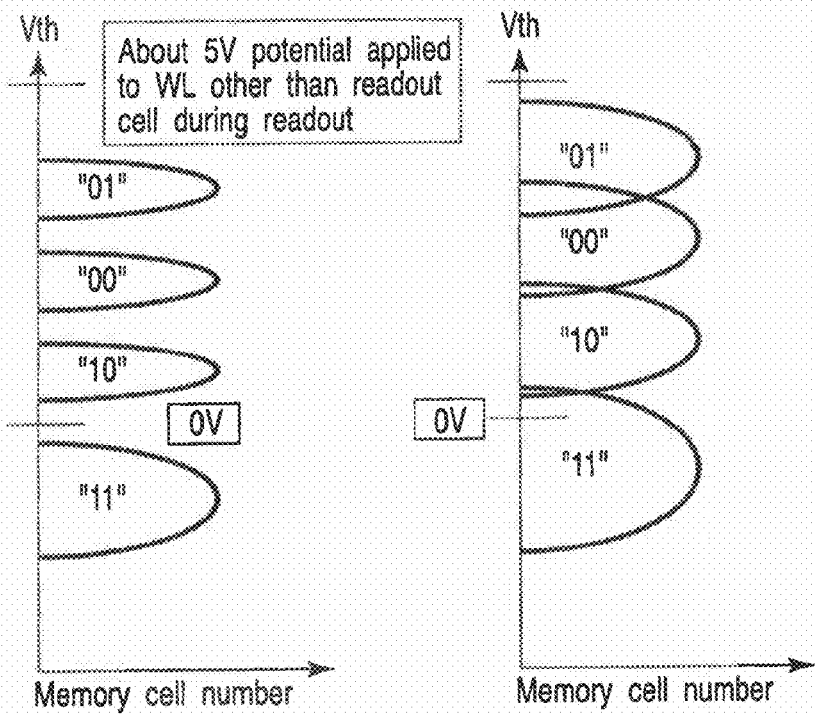
FIG. 2A is a threshold value distribution of the memory cells in a case where there is not any proximity effect.
FIG. 2B is a threshold value distribution of the memory cells in a case where there is the proximity effect.

In the NAND-type multivalued flash memory, a proximity effect has rapidly increased with miniaturization of a memory cell in recent years. The proximity effect means that a threshold value of the previously written memory cell during readout fluctuates depending on whether the adjacent memory cell is written or not with respect to the previously written memory cell as shown in FIG. 1. Since the threshold values are tightly distributed in the multivalued memory as shown in FIG. 2B, there is little margin with respect to a breadth of the distribution due to the proximity effect. It is to be noted that FIG. 2A shows a threshold value distribution in a case where there is not any proximity effect.

In an embodiment of the present invention, to realize a finer multivalued memory, there is proposed a system in which a threshold value shift of the proximity effect is predicted beforehand, and accordingly a data judgment potential of each memory cell is corrected during performing of readout, so that an influence of the proximity effect is eliminated.

There will be described a nonvolatile semiconductor memory device in an embodiment of the present invention with reference to the drawings. In the description with reference to all of the drawings, common components are denoted with common reference numerals.

First Embodiment

First, there will be described a nonvolatile semiconductor memory device in a first embodiment of the present invention.

Figure 3:
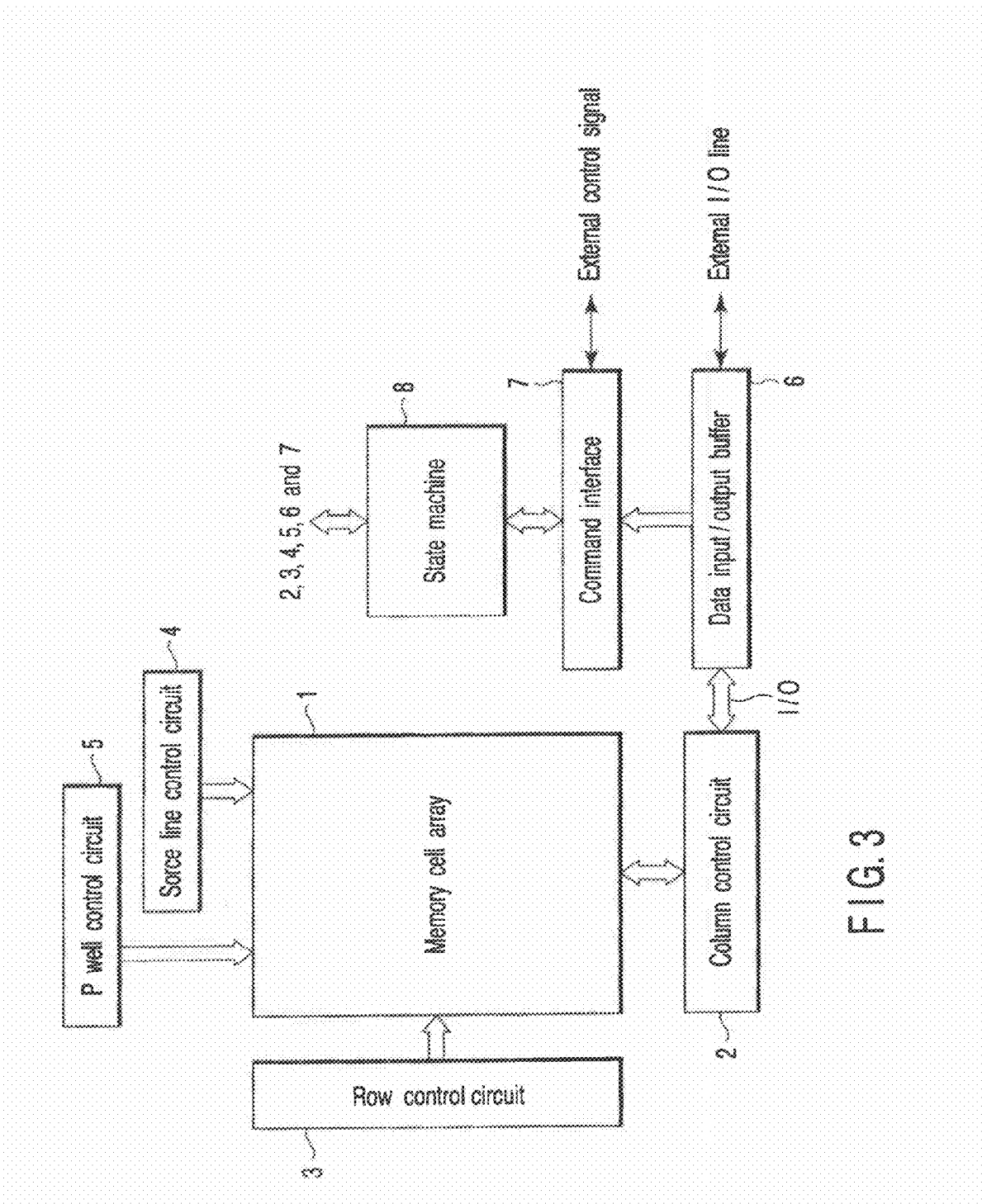
FIG. 3 is a block diagram showing a constitution of a nonvolatile semiconductor memory device in a first embodiment of the present invention.

FIG. 3 is a block diagram showing a constitution of the nonvolatile semiconductor memory device of the first embodiment.

In a memory cell array 1, nonvolatile semiconductor memory cells are arranged in a matrix form. One example of the nonvolatile semiconductor memory cell is a flash memory cell. A column control circuit 2 controls a bit line of the memory cell array 1, and performs erasing of data from the memory cells, writing of data into the memory cells, and reading of data from the memory cells. The column control circuit 2 is disposed adjacent to the memory cell array 1. A row control circuit 3 selects a word line of the memory cell array 1, and applies voltages required for the erasing, the writing, and the reading.

A source line control circuit (C-source control circuit) 4 controls a source line of the memory cell array 1. A P-well control circuit (C-p-well control circuit) 5 controls a potential of a P-type cell well in which the memory cell array 1 is formed.

A data input/output buffer 6 is electrically connected to the column control circuit 2 via an I/O line, and electrically connected to an external host (not shown) via an external I/O line. In the data input/output buffer 6, for example, an input/output buffer circuit is disposed. The data input/output buffer 6 receives write data, outputs readout data, and receives address data or command data. The data input/output buffer 6 sends the received write data to the column control circuit 2 via the I/O line, and receives the data read from the column control circuit 2 via the I/O line. Furthermore, the data input/output buffer 6 sends the address data to the column control circuit 2 or the row control circuit 3 via a state machine 8. The address data has been input from the outside in order to select an address of the memory cell array 1. The command data from an external host is sent to a command interface 7.

The command interface 7 receives a control signal from the external host via an external control signal line, and judges whether the data input into the data input/output buffer 6 is the write data, the command data, or the address data. When the data is the command data, the data is transferred as the received command data to the state machine 8. The state machine 8 manages the whole flash memory. That is, the state machine 8 receives the command data from the external host, and performs the reading, writing, and erasing of data. The state machine also manages input/output of the data. The state machine 8, the column control circuit 2, and the row control circuit 3 constitute a write circuit and a readout circuit.

Figure 4:
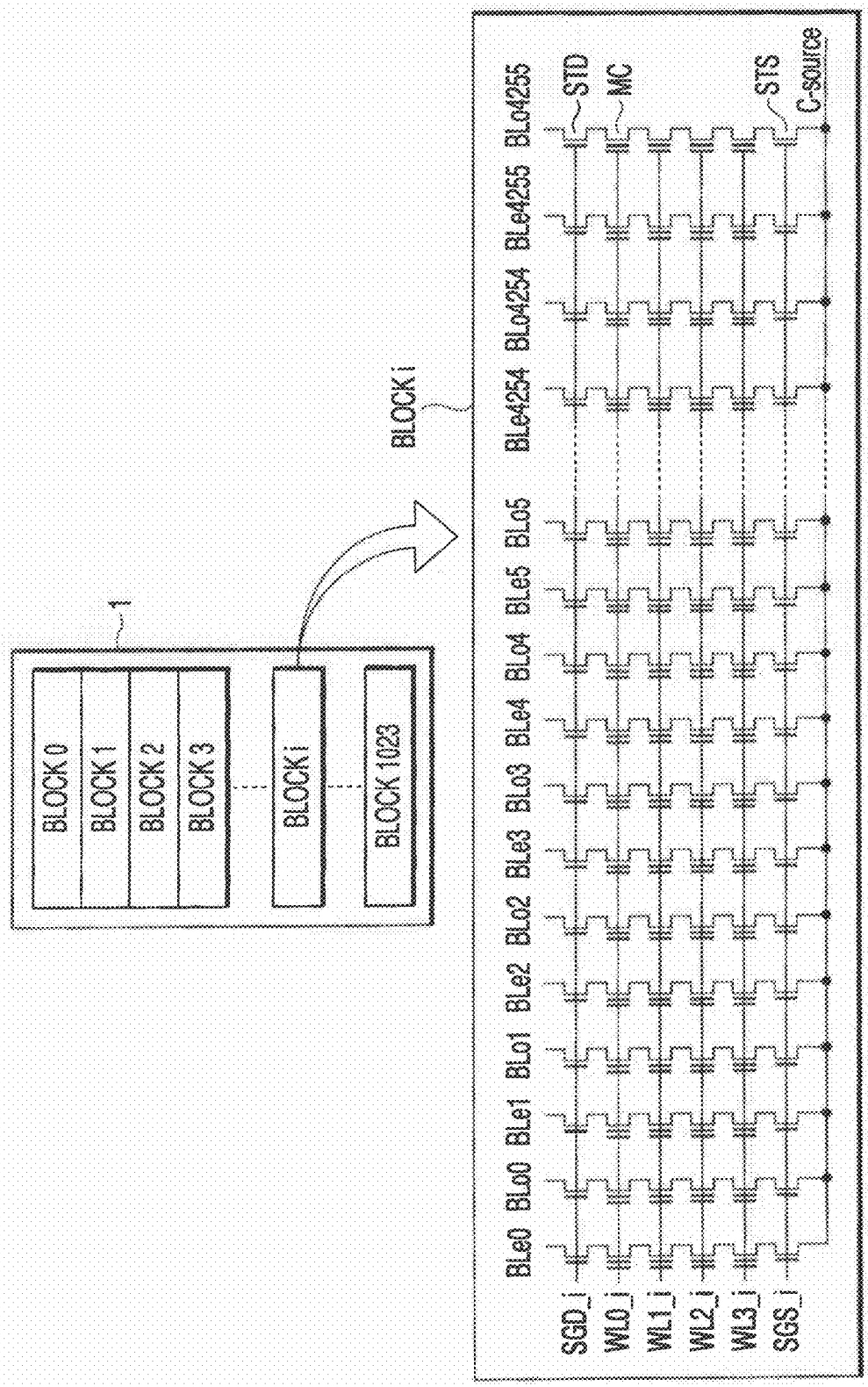
FIG. 4 is a diagram showing one example of a memory cell array in the nonvolatile semiconductor memory device of the first embodiment.

FIG. 4 is a diagram showing one example of the memory cell array 1 shown in FIG. 3.

The memory cell array 1 is divided into a plurality of blocks, for example, 1024 blocks BLOCK0 to BLOCK1023. The block is a minimum unit to be erased at once during the erase. Each block BLOCKi (i=0, 1, 2, . . . , 1023) includes a plurality of NAND-type memory units, for example, 8512 NAND-type memory units. In this example, each NAND-type memory unit includes two selection transistors STD and STS, and a plurality of memory cells MC (four memory cells in the present example) connected in series between the transistors.

One end of the NAND-type memory unit is connected to a bit line BL via the selection transistor STD connected to a selection gate line SGD, and the other end of the unit is connected to a common source line C-source via the selection transistor STS connected to a selection gate line SGS. Each memory cell MC is connected to a word line WL. In a bit line BLe which is an even-number-th counted from 0, and an odd-number-th bit line BLo, the data is independently written and read. Among 8512 memory cells connected to one word line WL, the data is simultaneously written and read with respect to 4256 memory cells connected to the bit lines BLe. Assuming that, for example, one-bit data is stored in each memory cell MC, the data stored in 4256 memory cells constitute a page. The page is, for example, a minimum readout unit. In a case where one memory cell MC stores 2-bit data, 4256 memory cells store data of two pages. Similarly, 4256 memory cells connected to the bit line BLo constitute other two pages, and the data is written or read simultaneously with respect to the memory cells of the page.

Figure 5:
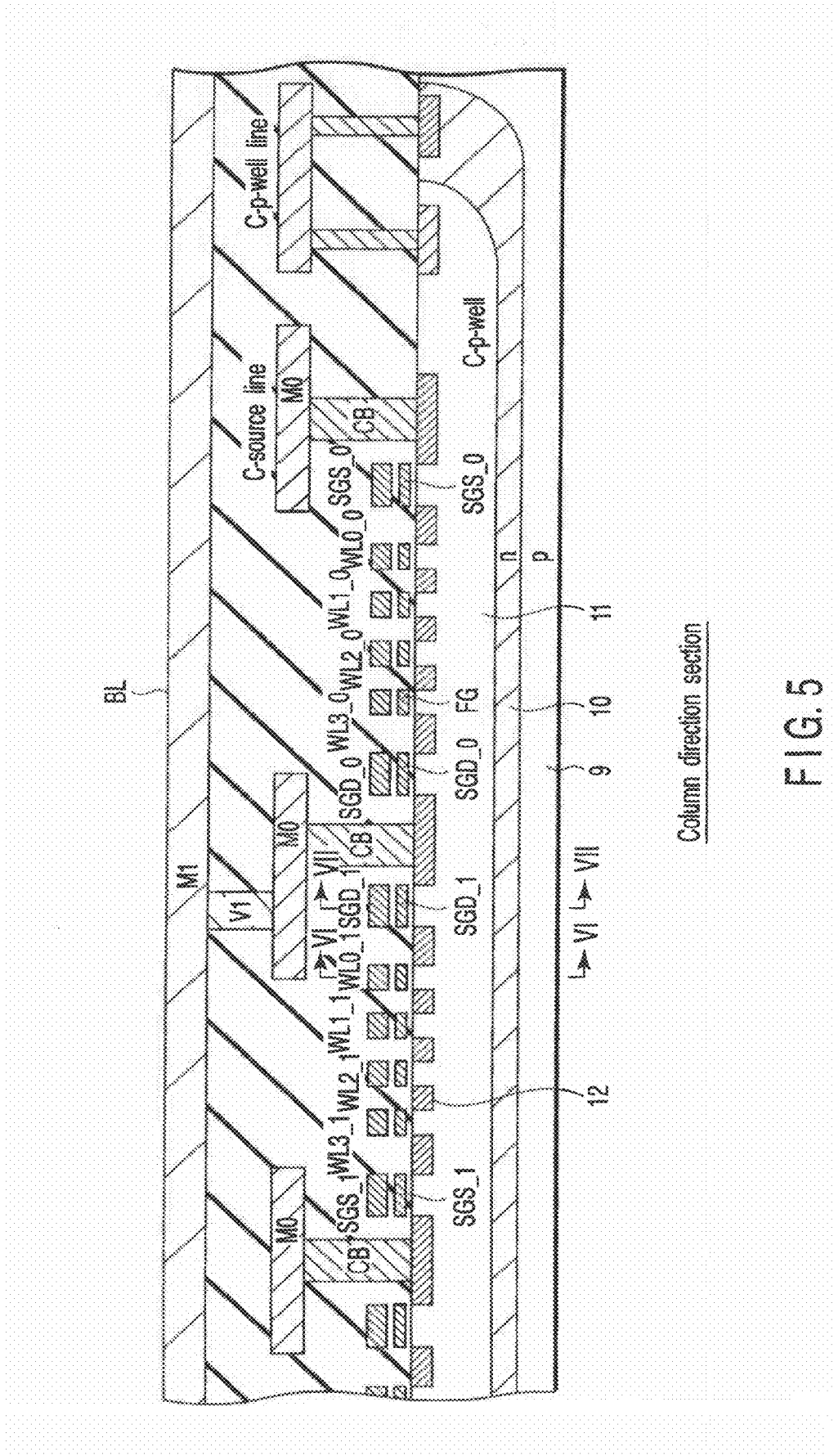
FIG. 5 is a sectional view showing one example of a column direction structure of the memory cell array in the nonvolatile semiconductor memory device of the first embodiment.

FIG. 5 is a sectional view showing one example of a column direction structure of the memory cell array 1 shown in FIG. 3.

An n-type cell well 10 is formed in a p-type semiconductor substrate 9. A p-type cell well 11 is formed in the n-type cell well 10. The memory cell MC includes an n-type diffusion layer 12, a floating gate FG, and a control gate which functions as the word line WL. The selection transistors STD and STS include the n-type diffusion layers 12, and double-structure gates which functions as the selection gate lines SGD and SGS. The word line WL and the selection gate lines SGD and SGS are connected to the row control circuit 3, and controlled by the row control circuit 3.

One end of the NAND-type memory unit is connected to a first metal wire layer M0 via a first contact CB, and further connected to a second metal wire layer M1 which functions as the bit line BL via a second contact V1. The bit line BL is connected to the column control circuit 2. The other end of the NAND-type memory unit is connected to the first metal wire layer M0 which functions as the common source line C-source via a first contact hole CB. The common source line C-source is connected to the source line control circuit 4. The n-type cell well 10 and the p-type cell well 11 are set to an equal potential, and are connected to the P-well control circuit 5 via a well line C-p-well.

FIGS. 6 and 7 are sectional views showing one example of a row direction structure of the memory cell array 1 shown in FIG. 3, and show sections cut along the lines VI-VI and VII-VII in FIG. 5, respectively.

As shown in FIG. 6, the respective memory cells MC are separated from one another by device separation STI. The floating gates FG are laminated on a channel area via a tunnel oxide film 14. The word line WL is laminated on the floating gate FG via an ONO film 15.

As shown in FIG. 5, the selection gate line SGS has a double structure. Although not shown, the upper and lower selection gate lines SGS are connected to an end of the memory cell array 1 or every certain number of bit lines.

FIG. 8 is a diagram showing the memory cell array 1 in the nonvolatile semiconductor memory device shown in FIG. 3, and a main part of the column control circuit 2.

The first NAND-type memory unit is connected to an even-number bit line (even-number BL) via a selection transistor STD1. This even-number bit line is connected to a sense amplifier/data latch circuit 21 via an even-number bit line selection transistor BLTe1. The second NAND-type memory unit is disposed adjacent to the first NAND-type memory unit, and the second NAND-type memory unit is connected to an odd-number bit line (odd-number BL). This odd-number bit line is connected to the sense amplifier/data latch circuit 21 via an odd-number bit line selection transistor BLTo1. The sense amplifier/data latch circuit 21 is connected to a state-storing latch circuit 22, and this state-storing latch circuit 22 is connected to a judgment potential correction circuit 23. The sense amplifier/data latch circuit 21 is also connected to the data input/output buffer 6. Gates of the memory cells which the first and second NAND-type memory units have are connected to word line WLn, WLn+1, WLn+2, and WLn+3, respectively.

Figure 9:
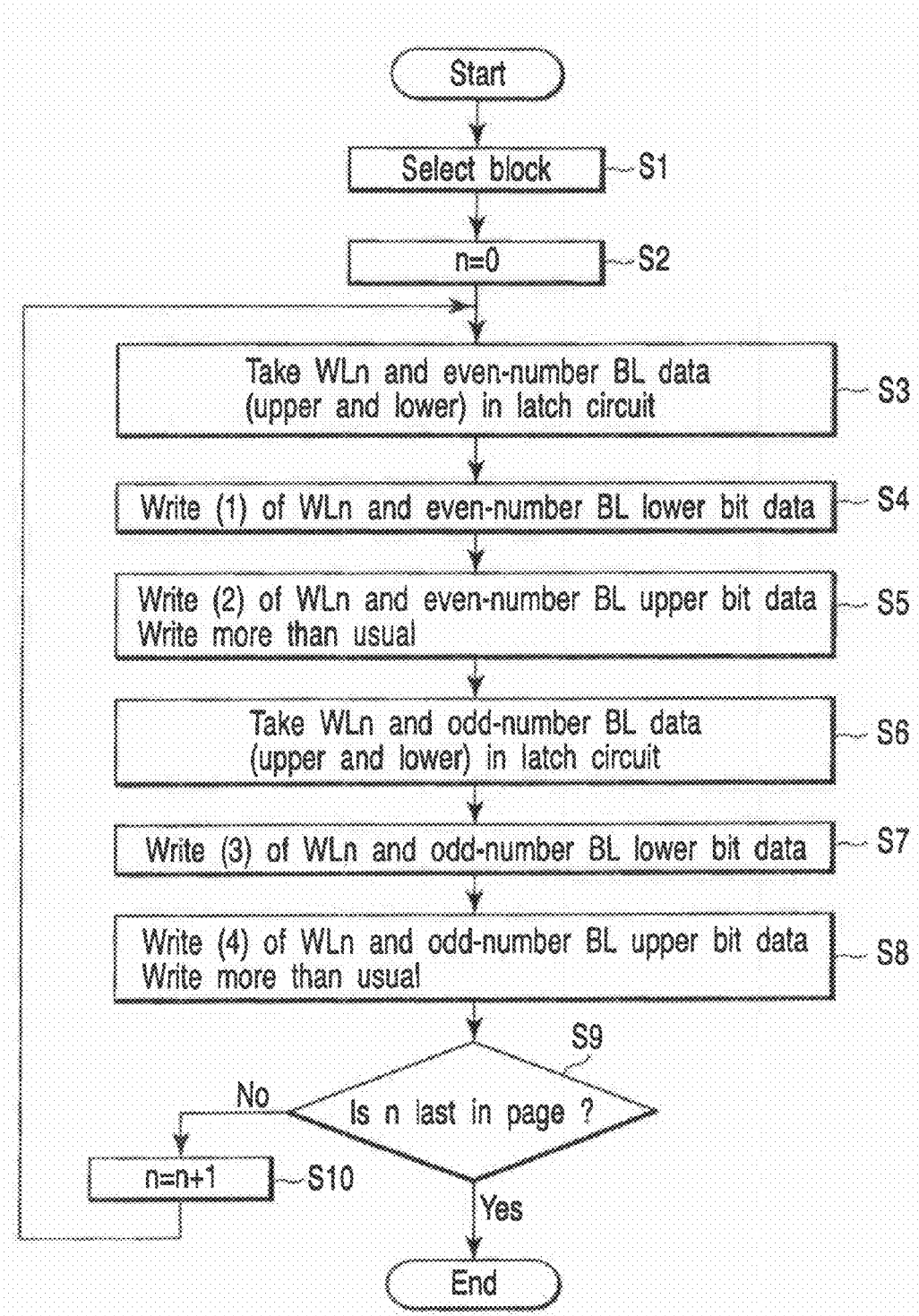
FIG. 9 is a flowchart showing a write operation in the nonvolatile semiconductor memory device of the first embodiment.
Figure 10A:
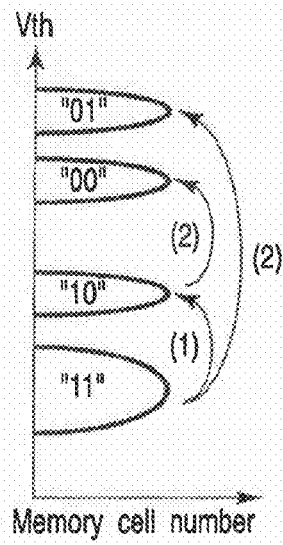
FIG. 10A shows a threshold value distribution in a case where there is not any proximity effect of the memory cells during writing into the nonvolatile semiconductor memory device.
Figure 10B:
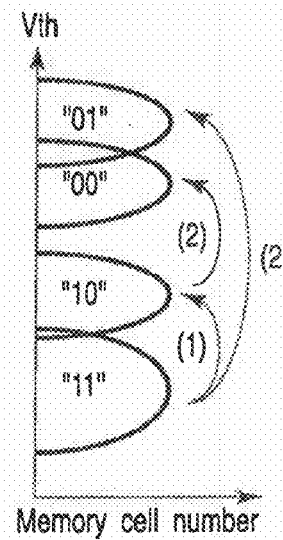
FIG. 10B shows a threshold value distribution in a case where there is the proximity effect of the memory cells during the writing into the nonvolatile semiconductor memory device.

FIG. 9 is a flowchart showing a write operation, and FIGS. 10A and 10B show threshold value distributions of memory cells during the writing. FIG. 10A shows a threshold value distribution before the distribution undergoes the proximity effect, and FIG. 102 shows a threshold value distribution at a time when the distribution undergoes the proximity effect.

The block is selected as a write object (step S1), and subsequently "n" is set to "0" (step S2). Moreover, in the block, as shown in FIG. 8, four values are written into each memory cell in order of (1) to (16).

First, the sense amplifier/data latch circuit 21 takes in lower and upper bit data to be written into a memory cell MC1 selected by the word line WLn and the even-number bit line (even-number BL) (step S3). Moreover, the lower bit data (1) is written into the memory cell MC1 selected by the word line WLn and the even-number bit line (step S4). Subsequently, the upper bit data (2) is written into the memory cell MC1 selected by the word line WLn and the even-number bit line (step S5). During the write of the upper bit data (2), the data is written more than usual, that is, the data is written so that the threshold value becomes higher than usual.

Next, the data latch circuit 21 takes in the lower and upper bit data to be written into memory cells MC2 and MC3 selected by the word line WLn and the odd-number bit line (odd-number BL) (step S6). Moreover, the lower bit data (3) is written into the memory cells MC2 and MC3 selected by the word line WLn and the odd-number bit line (step S7). Subsequently, the upper bit data (4) is written into the memory cells MC2 and MC3 selected by the word line WLn and the odd-number bit line (step S8). During the write of the upper bit data (4), the data is written more than usual, that is, the data is written so that the threshold value becomes higher than usual.

Thereafter, it is judged whether or not "n" is the last in the page (step S9). When "n" is the last in the page, the write operation ends. On the other hand, when "n" is not the last in the page, "n" is set to "n+1" (step S10), and the processing returns to the step S3 to perform similar processing. That is, the data latch circuit 21 takes in the lower bit data (5) and the upper bit data (6) to be written into the memory cell MC4 selected by the word line WLn+1 and the even-number bit line, and the lower bit data (5) and the upper bit data (6) are written in order into the memory cell MC4 selected by the word line WLn+1 and the even-number bit line. Subsequently, the data latch circuit 21 takes in the lower bit data (7) and the upper bit data (8) to be written into the memory cells MC5 and MC6 selected by the word line WLn+1 and the odd-number bit line, and the lower bit data (7) and the upper bit data (8) are written in order into the memory cells MC5 and MC6 selected by the word line WLn+1 and the odd-number bit line. Thereafter, similarly the lower bit data (9), the upper bit data (10), the lower bit data (11), the upper bit data (12), the lower bit data (13), the upper bit data (14), the lower bit data (15), and the upper bit data (16) are written in order.

Here, the memory cell MC1 in which the lower bit data (1) and the upper bit data (2) are first written receives the proximity effects from the memory cells MC2 and MC3 in which the data (3) and (4) are thereafter written and the memory cell MC4 in which the data (5) and (6) are written, and the threshold value shifts. When the data is written into all of the memory cells by repeating the above processing, as shown in FIG. 10B, the threshold value distribution expands owing to the influence of the proximity effect. As a result, data threshold value distributions overlap with each other, and the data cannot be judged.

To avoid this problem, during readout, the shift of the threshold value due to the influence of the proximity effect during the write is predicted from the memory cell (hereinafter referred to as the adjacent cell) disposed adjacent to the memory cell (hereinafter referred to as the readout cell) which is a readout object, and a judgment potential of the data is corrected every readout cell. This eliminates the influence of the proximity effect on the readout cell.

Figure 11:
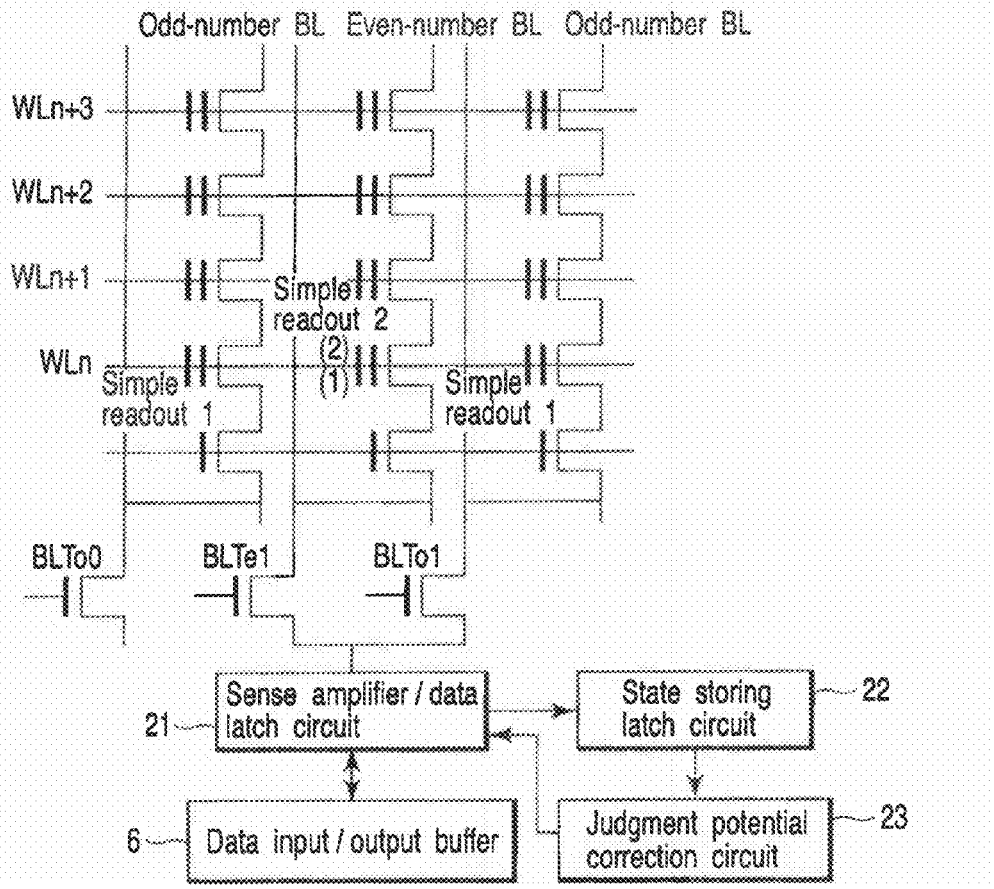
FIG. 11 is a diagram showing simple readout in the nonvolatile semiconductor memory device of the first embodiment.

Specifically, as shown in FIG. 11, the data is simply read from the memory cell of the bit line disposed adjacent to the readout cell (memory cell in which the data (1) and (2) have been written) and the memory cell of the word line disposed adjacent to the readout cell, and it is checked whether the threshold value is high or low. Moreover, in consideration of the threshold value shift due to the proximity effect that would be received by the readout cell from the respective read threshold values, the judgment potential for use in reading the data from the readout cell is corrected. That is, when the judgment potential is corrected into an appropriate value every memory cell, the influence due to the proximity effect can be suppressed as much as possible. The judgment potential is set to be high, when the surrounding close memory cell indicates a high threshold value. The judgment potential is set to be low, when the surrounding close memory cell indicates a low threshold value.

Moreover, during the write, as shown in FIG. 10B, two center threshold value distributions ("10" and "00") are detached from each other among the four-value threshold value distributions in order to judge without any mistake whether the threshold value is high or low even if there is a threshold value shift due to the proximity effect during the simple readout of the adjacent cells. To obtain a broad gap between two center threshold value distributions, the upper bit data is written to be larger than usual in the write flowchart shown in FIG. 9 (steps S5, S8). During this large write, even when there is the threshold value shift due to the proximity effect, the data can be written to such an extent that it can be judged without any mistake whether the threshold value is high or low.

Next, there will be described a readout operation in the nonvolatile semiconductor memory device of the first embodiment.

Figure 13:
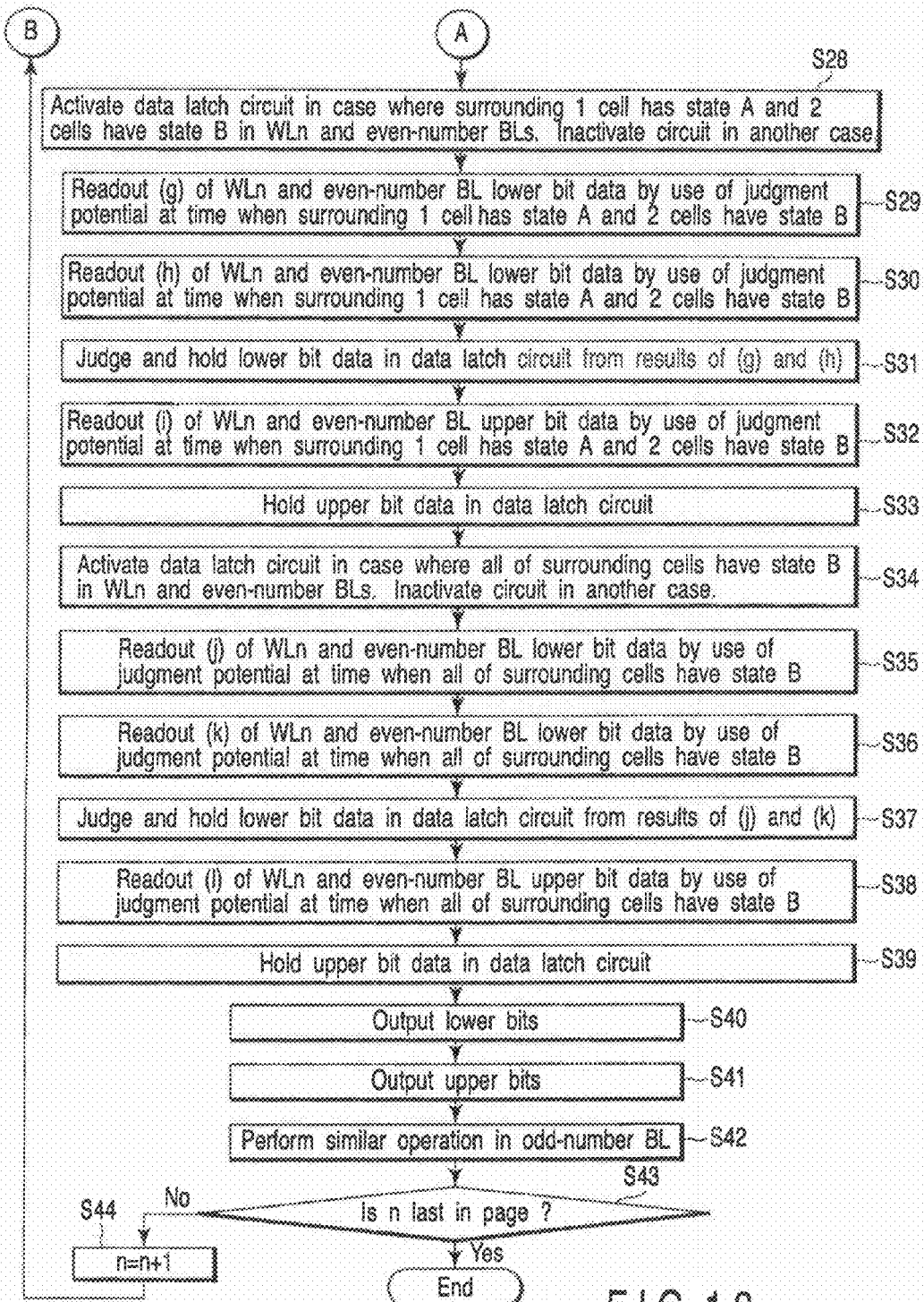
FIG. 13 is a second flowchart showing a readout operation in the nonvolatile semiconductor memory device of the first embodiment.

FIGS. 12 to 13 are flowcharts showing the readout operation, and FIGS. 14 to 18 show threshold value distributions of the memory cells from which the data is read during this readout.

First, a block as a readout object is selected (step S11), and subsequently "n" is set to "0" (step S12). Next, the simple readout is executed with respect to three memory cells (hereinafter referred to as the three surrounding cells) disposed adjacent to the memory cell (hereinafter referred to as the readout cell) as the readout object. That is, assuming that the readout cell is the memory cell selected by the word line WLn and the even-number bit line (even-number BL), simple readout 1 (shown in FIG. 11) is performed with respect to the memory cell selected by the word line WLn and the odd-number bit line (odd-number BL) (step S13). Subsequently, simple readout 2 (shown in FIG. 11) is performed with respect to the memory cell selected by the word line WLn+1 and the even-number bit line (step S14). It is to be noted that three surrounding cells refer to the memory cell which is disposed adjacent to the memory cell (readout cell) as the readout object and which is written after the readout cell among two memory cells connected to a bit line common to the readout cell, and two memory cells which are disposed adjacent to the readout cell and which are connected to a word line common to the readout cell.

Figure 14:
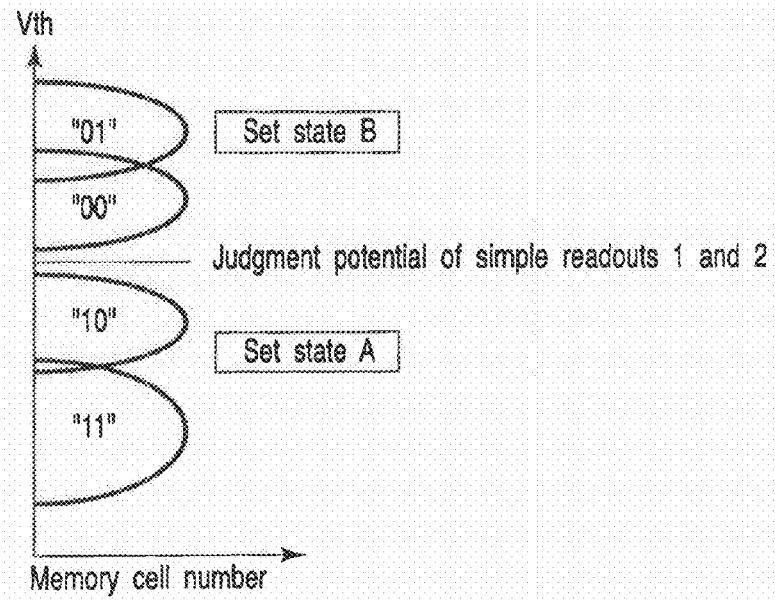
FIG. 14 shows a threshold value distribution during simple readout in the nonvolatile semiconductor memory device of the first embodiment.

Next, from results of the simple readouts 1 and 2 with respect to the three cells surrounding the readout cell, states of the three surrounding cells are input into the state-storing latch circuit 22 for each bit line (step S15). Here, as shown in FIG. 14, with respect to the judgment potentials of the simple readouts 1 and 2, it is assumed that a state in which the threshold value is lower than the judgment potential is state A and that a state in which the threshold value is higher than the judgment potential is state B. The states of the three surrounding cells held in the state-storing latch circuit 22 are output to the judgment potential correction circuit 23. The judgment potential correction circuit 23 corrects the judgment potential based on the states of the three surrounding cells. To be more specific, the judgment potential correction circuit 23 sets the judgment potential during the readout to V1 in a case where all of the three surrounding cells have the state A. The circuit sets the judgment potential during the readout to V4 in a case where two of the three surrounding cells have the state A and one cell has the state B. The circuit sets the judgment potential during the readout to V7 in a case where one of the three surrounding cells have the state A and two cells have the state B. Furthermore, the circuit sets the judgment potential during the readout to V10 in a case where all of the three surrounding cells have the state B.

Next, the data latch circuit 21 is activated in a case where all of the three surrounding cells have the state A in the word line WLn and each even-number bit line. In another case, that is, a case where all of the three surrounding cells do not have the state A, the data latch circuit 21 is inactivated (step S16).

Figure 15:
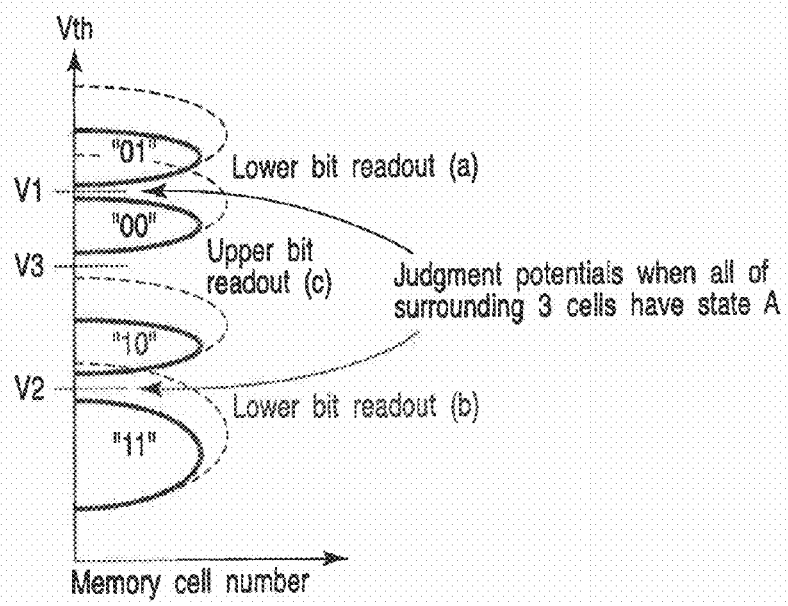
FIG. 15 shows a first threshold value distribution during readout in the nonvolatile semiconductor memory device of the first embodiment.

Subsequently, as shown in FIG. 15, the lower bit data is read (a) from the memory cell selected by the word line WLn and the even-number bit line by use of the judgment potential V1 at a time when all of the three surrounding cells have the state A (step S17). Furthermore, the lower bit data is read (b) from the memory cell selected by the word line WLn and the even-number bit line by use of the judgment potential V2 at a time when all of the three surrounding cells have the state A (step S18).

From the results of (a) and (b), the lower bit data is judged and held in the data latch circuit (step S19). Furthermore, the upper bit data is read (c) from the memory cell selected by the word line WLn and the even-number bit line by use of the judgment potential V3 at a time when all of the three surrounding cells have the state A (step S20). The read upper bit data is held in the data latch circuit (step S21).

Next, the data latch circuit 21 is activated in a case where two of the three surrounding cells have the state A and the remaining cell has the state B in the word line WLn and each even-number bit line. In another case, the data latch circuit 21 is inactivated (step S22).

Figure 16:
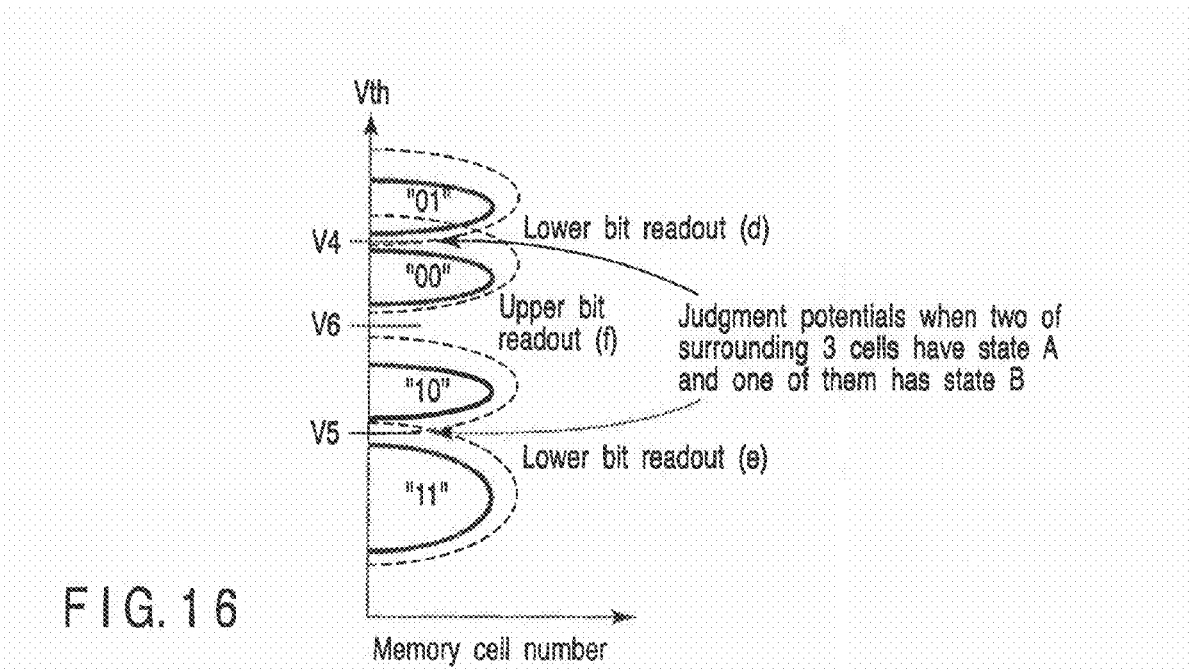
FIG. 16 shows a second threshold value distribution during the readout in the nonvolatile semiconductor memory device of the first embodiment.

Subsequently, as shown in FIG. 16, the lower bit data is read (d) from the memory cell selected by the word line WLn and the even-number bit line by use of the judgment potential V4 at a time when two of the three surrounding cells have the state A and the remaining cell has the state B (step S23). Furthermore, the lower bit data is read (e) from the memory cell selected by the word line WLn and the even-number bit line by use of the judgment potential V5 at a time when two of the three surrounding cells have the state A and the remaining cell has the state B (step S24).

From the results of (d) and (e), the lower bit data is judged and held in the data latch circuit 21 (step S25). Furthermore, the upper bit data is read (f) from the memory cell selected by the word line WLn and the even-number bit line by use of the judgment potential V6 at a time when two of the three surrounding cells have the state A and one of them has the state B (step S26). The read upper bit data is held in the data latch circuit 21 (step S27).

Next, the data latch circuit 21 is activated in a case where one of the three surrounding cells has the state A and the two remaining cells have the state B in the word line WLn and each even-number bit line. In another case, the data latch circuit 21 is inactivated (step S28).

Figure 17:
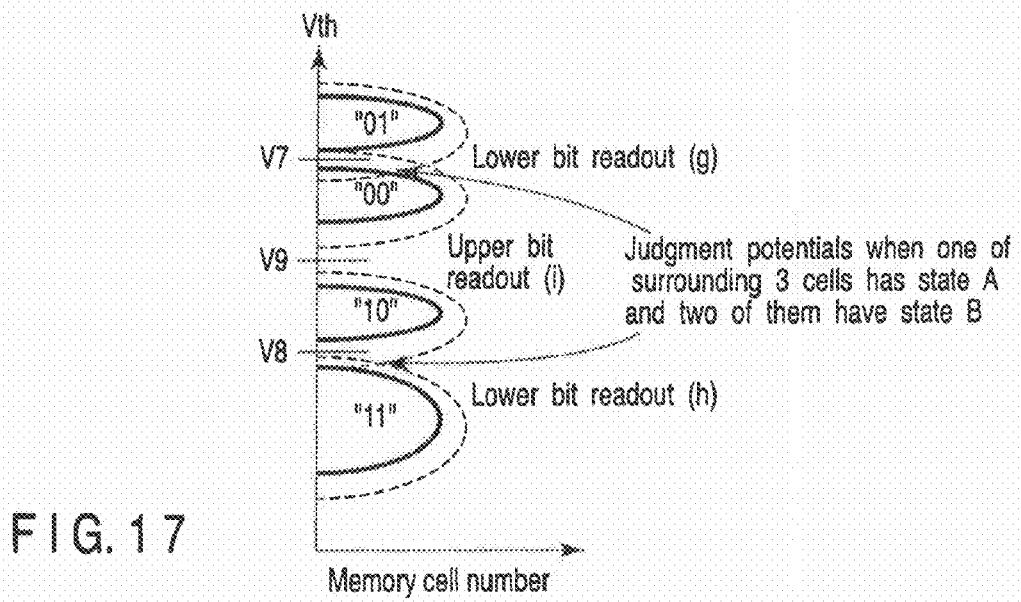
FIG. 17 shows a third threshold value distribution during the readout in the nonvolatile semiconductor memory device of the first embodiment.

Subsequently, as shown in FIG. 17, the lower bit data is read (g) from the memory cell selected by the word line WLn and the even-number bit line by use of the judgment potential V7 at a time when one of the three surrounding cells has the state A and two of them have the state B (step S29). Furthermore, the lower bit data is read (h) from the memory cell selected by the word line WLn and the even-number bit line by use of the judgment potential V8 at a time when one of the three surrounding cells has the state A and two of them have the state B (step S30).

From the results of (g) and (h), the lower bit data is judged and held in the data latch circuit 21 (step S31). Furthermore, the upper bit data is read (i) from the memory cell selected by the word line WLn and the even-number bit line by use of the judgment potential V9 at a time when one of the three surrounding cells has the state A and two of them have the state B (step S32). The read upper bit data is held in the data latch circuit 21 (step S33).

Next, the data latch circuit 21 is activated in a case where all of the three surrounding cells have the state B in the word line WLn and each even-number bit line. In another case, that is, a case where all of the three surrounding cells do not have the state B, the data latch circuit 21 is inactivated (step S34).

Figure 18:
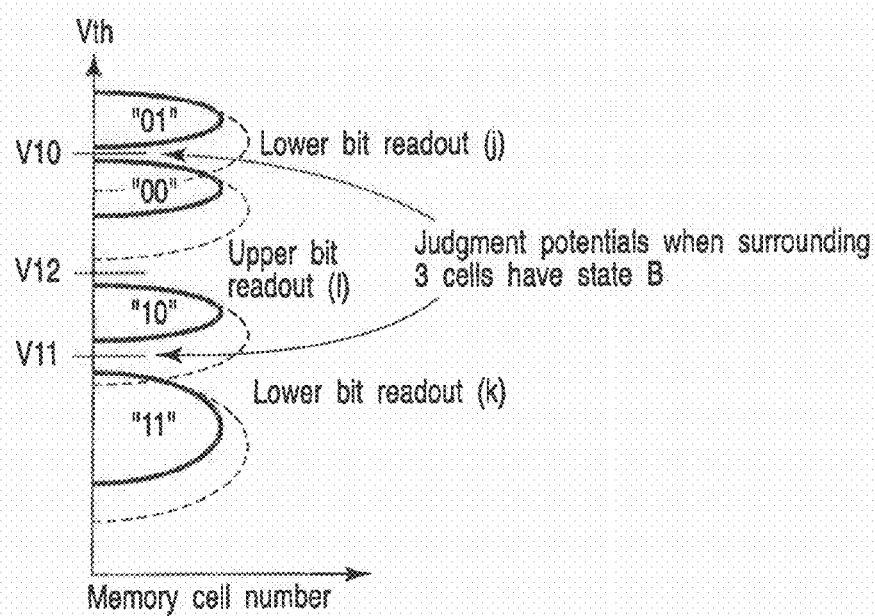
FIG. 18 shows a fourth threshold value distribution during the readout in the nonvolatile semiconductor memory device of the first embodiment.

Subsequently, as shown in FIG. 18, the lower bit data is read (j) from the memory cell selected by the word line WLn and the even-number bit line by use of the judgment potential V10 at a time when all of the three surrounding cells have the state B (step S35). Furthermore, the lower bit data is read (k) from the memory cell selected by the word line WLn and the even-number bit line by use of the judgment potential V11 at a time when all of the three surrounding cells have the state B (step S36).

From the results of (j) and (k), the lower bit data is judged and held in the data latch circuit 21 (step S37). Furthermore, the upper bit data is read (l) from the memory cell selected by the word line WLn and the even-number bit line by use of the judgment potential V12 at a time when all of the three surrounding cells have the state B (step S38). The read upper bit data is held in the data latch circuit 21 (step S39).

Next, the lower bit data of the readout cell is output from the data latch circuit 21 via the data input/output buffer 6 (step S40). Subsequently, the upper bit data of the same cell is output from the data latch circuit 21 via the data input/output buffer 6 (step S41).

Thereafter, the similar operation is performed with respect to the odd-number bit line (step S42). Thereafter, it is judged whether or not "n" is the last in the page (step S43). When "n" is the last in the page, the write operation ends. On the other hand, when "n" is not the last in the page, "n" is set to "n+1" (step S44). The processing returns to the step S13, and the processing of and after the step S13 is similarly performed.

As described above, in this first embodiment, during the readout, the shift of the threshold value due to the influence of the proximity effect during the write is predicted from the memory cell disposed adjacent to the memory cell (readout cell) which is the readout object, and the judgment potential of the data is corrected every readout cell. This eliminates the influence of the proximity effect on the readout cell.

Second Embodiment

Next, there will be described a nonvolatile semiconductor memory device in a second embodiment of the present invention.

In the above-described first embodiment, during the write, the memory cell connected to the odd-number bit line does not receive any proximity effect of a memory cell connected to an even-number bit line adjacent to a memory cell connected to an odd-number bit line. This is because the data is first written into the memory cell of the even-number bit line, and thereafter the data is written into the memory cell of the odd-number bit line. Therefore, the simple readout is not performed with respect to the memory cell connected to the bit line adjacent to the memory cell of the odd-number bit line during the readout from the memory cell of the odd-number bit line, and the simple readout is performed with respect to the only memory cell connected to the adjacent word line, and the judgment potential of the readout cell is corrected.

Figure 19:
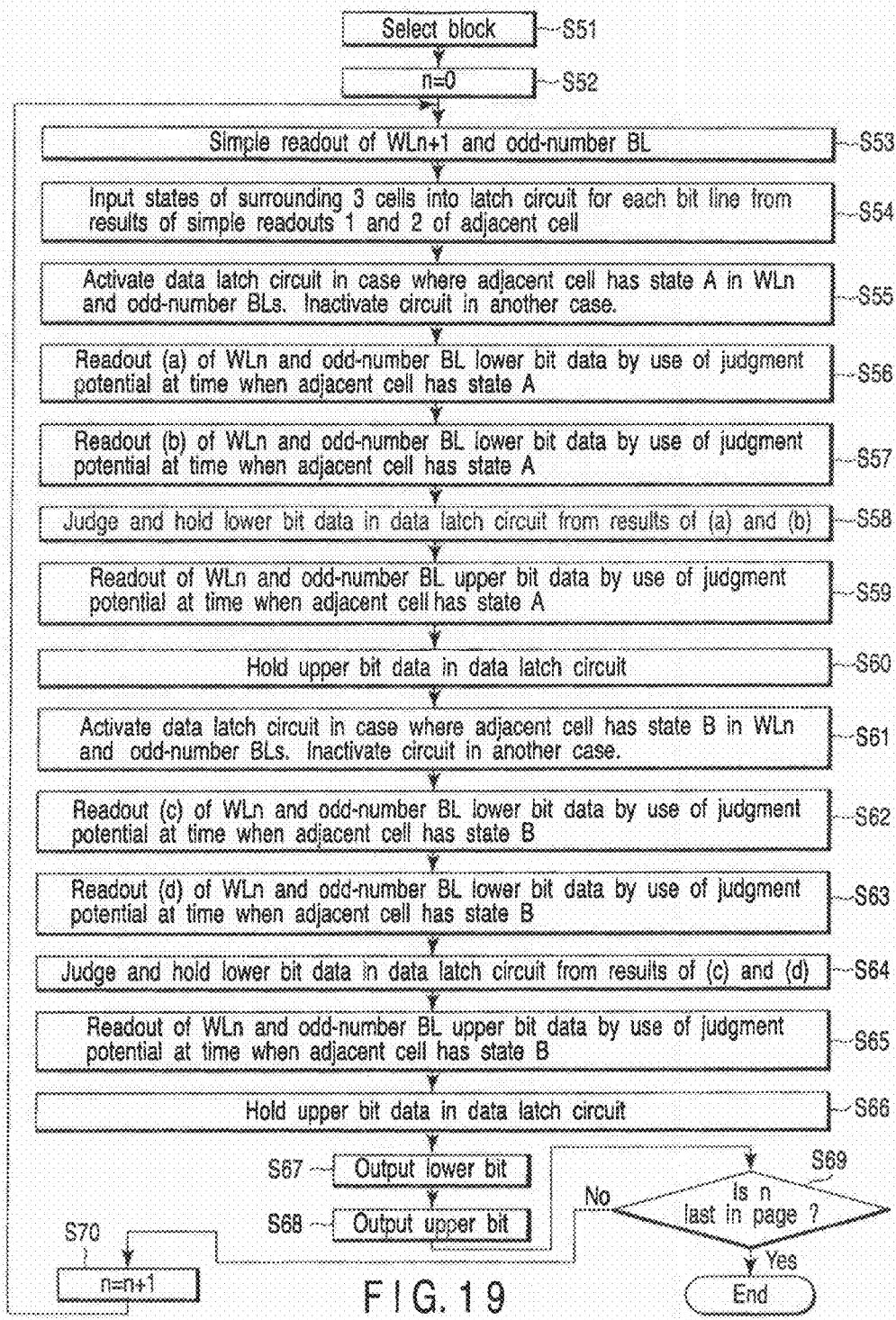
FIG. 19 is a flowchart showing a readout operation in a nonvolatile semiconductor memory device of a second embodiment of the present invention.

FIG. 19 is a flowchart showing a readout operation in the nonvolatile semiconductor memory device of the second embodiment.

First, a block as a readout object is selected (step S51), and subsequently "n" is set to "0" (step S52). Next, the simple readout is executed with respect to a memory cell (hereinafter referred to as the adjacent cell) which is disposed adjacent to the memory cell (hereinafter referred to as the readout cell) as the readout object and which is connected to an odd-number bit line common to the readout cell. That is, assuming that the readout cell is the memory cell selected by the word line WLn and the odd-number bit line (odd-number BL), the simple readout is performed with respect to the memory cell selected by the word line WLn+1 and the odd-number bit line (step S53).

Next, from results of the simple readout from the adjacent cell, a state of the adjacent cell is input into a state-storing latch circuit 22 for each bit line (step S54). The state of the adjacent cell held in the state-storing latch circuit 22 is output to a judgment potential correction circuit 23. The judgment potential correction circuit 23 corrects a judgment potential for use during readout based on the state of the adjacent cell.

Next, the data latch circuit 21 is activated in a case where the adjacent cell has a state A in a word line WLn and each odd-number bit line. In another case, that is, a case where the adjacent cell is not in the state A, the data latch circuit 21 is inactivated (step S55).

Subsequently, lower bit data is read (a) from the memory cell selected by the word line WLn and the odd-number bit line by use of a judgment potential V13 at a time when the adjacent cell is in the state A (step S56). Furthermore, the lower bit data is read (b) from the memory cell selected by the word line WLn and the odd-number bit line by use of judgment potential V14 at a time when the adjacent cell has the state A (step S57).

From the results of (a) and (b), the lower bit data is judged and held in the data latch circuit 21 (step S58). Furthermore, upper bit data is read from the memory cell selected by the word line WLn and the odd-number bit line by use of judgment potential V15 at a time when the adjacent cell has the state A (step S59). The read upper bit data is held in the data latch circuit 21 (step S60).

Next, the data latch circuit 21 is activated in a case where the adjacent cell has the state B in the word line WLn and each odd-number bit line. In another case, that is, in a case where the adjacent cell does not have state B, the data latch circuit 21 is inactivated (step S61).

Subsequently, the lower bit data is read (c) from the memory cell selected by the word line WLn and the odd-number bit line by use of judgment potential V16 at a time when the adjacent cell has the state B (step S62). Furthermore, the lower bit data is read (d) from the memory cell selected by the word line WLn and the odd-number bit line by use of judgment potential V17 at a time when the adjacent cell has the state B (step S63).

From the results of (c) and (d), the lower bit data is judged and held in the data latch circuit 21 (step S64). Furthermore, the upper bit data is read from the memory cell selected by the word line WLn and the odd-number bit line by use of judgment potential V18 at a time when the adjacent cell has the state B (step S65). The read upper bit data is held in the data latch circuit 21 (step S66).

Next, the lower bit data of the readout cell is output from the data latch circuit 21 via a data input/output buffer 6 (step S67). Subsequently, the upper bit data of the same cell is output from the data latch circuit 21 via the data input/output buffer 6 (step S68). Thereafter, it is judged whether or not "n" is the last in a page (step S69). When "n" is the last in the page, the write operation ends. On the other hand, when "n" is not the last in the page, "n" is set to "n+1" (step S70). The processing returns to the step S53, and the processing of and after the step S53 is similarly performed.

As described above, in the second embodiment, the simple readout is not performed with respect to the memory cell which is disposed adjacent to the memory cell (readout cell) as the readout object and which is connected to the word line common to the readout cell. The simple readout is performed with respect to the only memory cell that is connected to the bit line common to the readout cell. According to the result of this simple readout, the judgment potential during the readout from the readout cell is set. Since the simple readout is not performed with respect to the memory cell which is disposed adjacent to the memory cell as the readout object and which is connected to the word line common to the memory cell as the readout object in this manner, a readout time is reduced.

Third Embodiment

Next, there will be described a nonvolatile semiconductor memory device in a third embodiment of the present invention.

In this third embodiment, the order of memory cells to be written is devised. Accordingly, a proximity effect is produced only during write of upper bit data.

Figure 20:
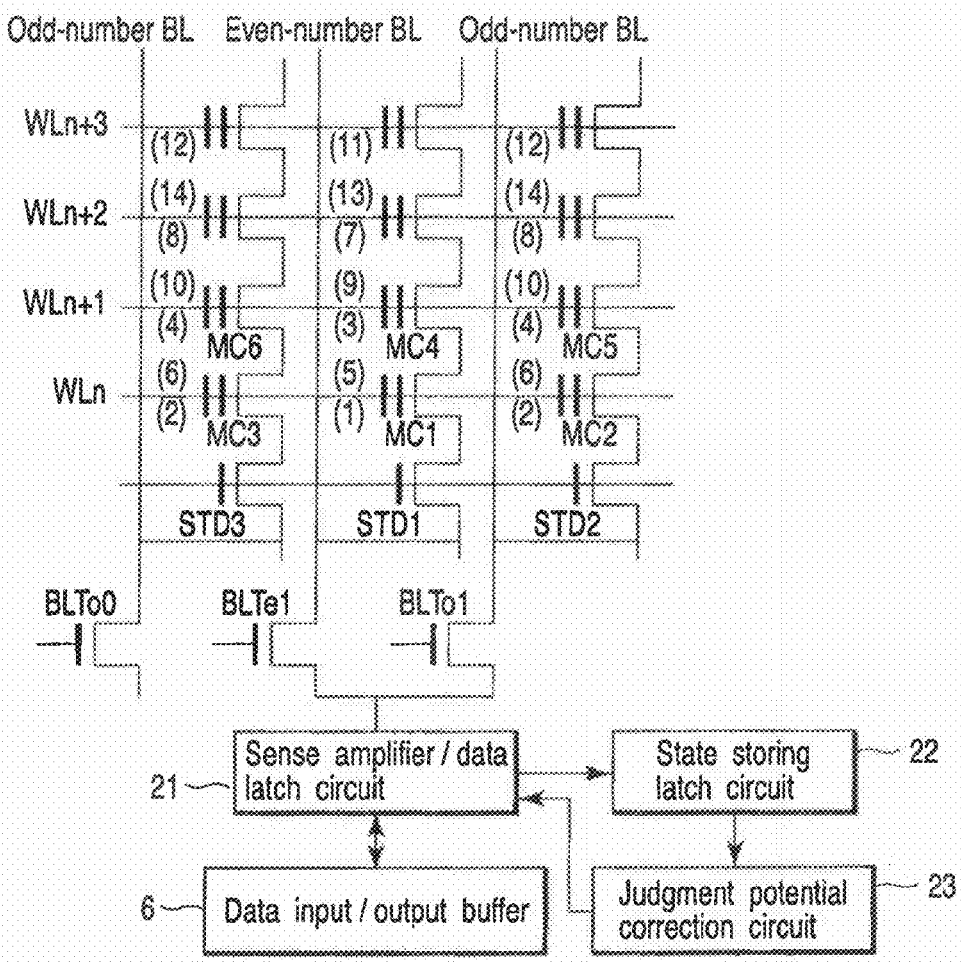
FIG. 20 is a diagram showing a write order into memory cells in a nonvolatile semiconductor memory device of a third embodiment of the present invention.

FIG. 20 is a diagram showing a memory cell array 1, a main part of a column control circuit 2, and the write order into the memory cells in the nonvolatile semiconductor memory device of the third embodiment.

As shown in FIG. 20, four values are written into each memory cell in order of (1) to (14). First, lower bit data (1) is written into a memory cell MC1 selected by a word line WLn and an even-number bit line (even-number BL). Subsequently, lower bit data (2) is written into memory cells MC2 and MC3 selected by the word line WLn and an odd-number bit line (odd-number BL). Next, lower bit data (3) is written into a memory cell MC4 selected by a word line WLn+1 and an even-number bit line. Subsequently, lower bit data (4) is written into memory cells MC5 and MC6 selected by the word line WLn+1 and the odd-number bit line. Next, upper bit data (5) is written into the memory cell MC1 selected by the word line WLn and the even-number bit line. Subsequently, upper bit data (6) is written into the memory cells MC2 and MC3 selected by the word line WLn and the odd-number bit line. Next, lower bit data (7) is written into a memory cell MC7 selected by a word line WLn+2 and the even-number bit line. As shown in FIG. 20, the write is hereinafter performed in order of (8) to (14).

Figure 21:
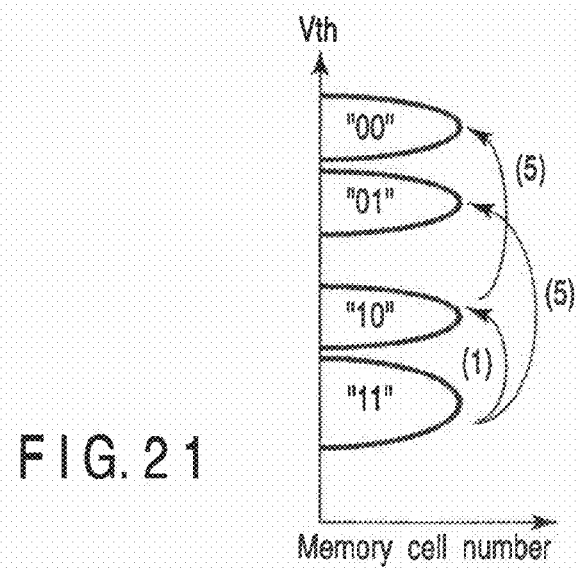
FIG. 21 shows a threshold value distribution of the memory cells written in the third embodiment.

FIG. 21 shows a threshold value distribution of the written memory cells by the write shown in FIG. 20. FIG. 21 shows a distribution before the distribution undergoes the proximity effect. In the write shown in FIG. 20, the proximity effect is produced only during the write of the upper bit data. Therefore, since a breadth of the threshold value distribution due to the proximity effect of the memory cells can be suppressed, there can be obtained a broad threshold value distribution before undergoing the proximity effect. In consequence, a step width of a step-up voltage of a write pulse can be broadened, and a write time can be reduced. Another constitution and a readout operation are similar to those of the first embodiment.

Fourth Embodiment

Next, there will be described a nonvolatile semiconductor memory device in a fourth embodiment of the present invention.

In the above third embodiment, during readout, there are predicted proximity effects of both of a memory cell connected to a word line adjacent to a readout cell and a memory cell connected to a bit line adjacent to the readout cell, and a judgment potential during the readout is corrected. However, in a case where the memory cell connected to the adjacent word line has a strong proximity effect, and the memory cell connected to the adjacent bit line has a weak proximity effect, simple readout is performed from the memory cell connected to the adjacent word line, and the judgment potential of the readout cell is corrected.

In the fourth embodiment, the simple readout is not performed from a memory cell which is disposed adjacent to the readout cell and which is connected to a word line common to the readout cell, and the simple readout is performed from the only memory cell that is disposed adjacent to the readout cell and that is connected to a bit line common to the readout cell in the same manner as in the above second embodiment. According to this simple readout result, the judgment potential during the readout from the readout cell is set. In this manner, the simple readout is not performed from the memory cell which is disposed adjacent to the memory cell as the readout object and which is connected to the word line common to the memory cell as the readout object. Consequently, a readout time is reduced. A detailed readout operation is similar to that of the second embodiment of FIG. 19.

According to the embodiments of the present invention, there can be provided a nonvolatile semiconductor memory device capable of eliminating an influence of a threshold value fluctuation (proximity effect) generated by a parasitic capacity between adjacent memory cells.

Moreover, the above embodiments can be carried out alone, or an appropriate combination of the embodiments can be carried out. Furthermore, the above-described embodiments include various stages of inventions, and various stages of inventions can be extracted by appropriate combinations of a plurality of constituting factors disclosed in the respective embodiments.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general invention concept as defined by the appended claims and their equivalents.

What is claimed is:

1. A nonvolatile semiconductor memory device comprising:
    a memory cell array including a plurality of memory cells arranged in a matrix form, the plurality of memory cells including a first memory cell, a second memory cell and a third memory cell, the first memory cell being connected to a word line, the second memory cell being disposed adjacent to the first memory cell and connected to the word line and a bit line, and the third memory cell being disposed adjacent to the second memory cell and connected to the bit line;
    a write circuit which writes data into the second memory cell after writing data into the first memory cell;
    a judgment potential correction circuit which corrects a judgment potential based on threshold values of the first and third memory cell disposed adjacent to the second memory cell; and
    a readout circuit which reads the second memory cell by use of the judgment potential corrected by the judgment potential correction circuit.

2. The nonvolatile semiconductor memory device according to claim 1,
    wherein the judgment potential correction circuit obtains, from the threshold value of the third memory cell, a threshold value fluctuation of the second memory cell generated by a parasitic capacity between the second memory cell and the third memory cell, and corrects the judgment potential based on the threshold value fluctuation.

3. The nonvolatile semiconductor memory device according to claim 1,
    wherein the first memory cell is connected to even-number bit line, and the second and third memory cells are connected to odd-number bit line.

4. The nonvolatile semiconductor memory device according to claim 1,
    wherein each of the first, second, and third memory cells is a nonvolatile memory cell having a control gate and a floating gate.

5. The nonvolatile semiconductor memory device according to claim 1,
    wherein the write circuit writes data into the third memory cell after writing data into the second memory cell.

6. A nonvolatile semiconductor memory device comprising:
    a memory cell array including a plurality of memory cells arranged in a matrix form, the plurality of memory cells including a first memory cell, a second memory cell, a third memory cell and a fourth memory cell, the first memory cell being connected to a first word line and a first bit line, the second memory cell being disposed adjacent to the first memory cell and connected to the first word line and a second bit line, the third memory cell being disposed adjacent to the first memory cell and connected to the first bit line, and the fourth memory cell being disposed adjacent to the second memory cell and connected to the second bit line;
    a write circuit which writes data into the memory cells;
    a judgment potential correction circuit which corrects judgment potentials based on threshold values of the memory cells; and
    a readout circuit which reads the memory cells by use of the judgment potentials corrected by the judgment potential correction circuit,
    wherein when the write circuit writes data into the first memory cell, the second memory cell, the third memory cell and the fourth memory cell in this order,
    in case of the readout circuit reads the first memory cell, the judgment potential correction circuit corrects a first judgment potential based on threshold values of the second and third memory cells, and the readout circuit reads the first memory cell by use of the first judgment potential, and
    in case of the readout circuit reads the second memory cell, the judgment potential correction circuit corrects a second judgment potential based on a threshold value of the fourth memory cell, and the readout circuit reads the second memory cell by use of the second judgment potential.

* * * * *